United States Patent [19]

Kitamura et al.

[11] Patent Number: 5,097,120
[45] Date of Patent: Mar. 17, 1992

[54] CONTACT TYPE IMAGE SENSOR DEVICE

[75] Inventors: Koichi Kitamura; Hidenori Mimura; Kazuo Yamamoto; Yasumitsu Ohta; Kazuyoshi Sai, all of Kawasaki, Japan

[73] Assignee: Nippon Steel Corporation, Tokyo, Japan

[21] Appl. No.: 640,084

[22] Filed: Jan. 11, 1991

Related U.S. Application Data

[63] Continuation of Ser. No. 503,179, Apr. 2, 1990, Pat. No. 5,004,903.

[30] Foreign Application Priority Data

Mar. 31, 1989 [JP] Japan .................................. 1-81258

[51] Int. Cl.⁵ .............................................. H01J 40/14
[52] U.S. Cl. ................................. 250/208.1; 250/211 J
[58] Field of Search ...................... 250/208.1, 211 J; 357/30 H

[56] References Cited

U.S. PATENT DOCUMENTS 4,764,682  8/1988  Swartz .................... 250/211 J
4,980,546 12/1990  Berger .................... 250/211 J Primary Examiner—David C. Nelms
Assistant Examiner—K. Shami
Attorney, Agent, or Firm—Spencer & Frank

[57] ABSTRACT

A contact type image sensor device comprises a plurality of photodiodes connected in a matrix, and an equal number of blocking diodes. A capacity ratio of a photo electric part constituting the photodiodes to a diode part constituting the blocking diode is in the range of 2:1 to 30:1. Dynamic range, magnitude of the signal current, light sensitivity and after image characteristics of the image sensor are improved according to the invention.

17 Claims, 6 Drawing Sheets

Cp=Cb

CONTACT TYPE IMAGE SENSOR DEVICE

This is a continuation of application Ser. No. 07/503,179, now U.S. Pat. No. 5,004,903 filed Apr. 2, 1990.

BACKGROUND OF THE INVENTION

1. Field of the Invention

This invention relates to a contact type image sensor device which senses an image of objects without reduction of the image. The contact image sensor device is utilized for small-sized facsimile terminal equipment, a bar code reader, and the like.

2. Description of the Related Art

Since a contact image sensor device can sense an image of objects without use of an optical system for reduction of the image, the length of an optical path can be so shortened that equipment comprising the contact image sensor device can be miniaturized. For this reason, recently, contact image sensor devices are widely used as image sensing units in small sized facsimile terminal equipment, bar code readers, and the like.

Though various types of contact image sensor devices are known, the contact image sensor device of the present invention is a type of sensor device which comprises a plurality of photodiodes connected in a matrix and an equal number of blocking diodes provided with each photodiode to prevent a so-called cross talk phenomenon. In this type of contact image sensor device, both the photodiodes and the blocking diodes may be constituted by diodes having the same construction, so that the degree of integration of the sensor elements can be increased and they can be easily fabricated.

U.S. Pat. No. 4,369,372 discloses a photo electro transducer device which comprises n photo electro transducer elements and n diode elements connected respectively to the n photo electro transducer elements. A photo electro transducer element and a respective diode element are formed either on the same side of a common electrode area or formed in layers.

Both the photodiode and the blocking diode have junction capacitances $C_p$ and $C_b$, respectively. The capacitances $C_p$ and $C_b$ are equivalently connected to the photodiode and the blocking diode, respectively, in parallel. In order to derive a signal current depending on the brightness of a pixel from each photodiode connected in a matrix, a pulsed voltage is applied to the serially connected photodiode and blocking diode. Accordingly, the values of $C_p$ and $C_b$, especially the ratio of $C_p$ to $C_b$, is an important factor in determining the dynamic range, magnitude of the signal current and light sensitivity of the image sensor device. However, these points are not described in the U.S. Pat. No. 4,369,372.

SUMMARY OF THE INVENTION

An object of the present invention is to provide a contact image sensor device comprising a plurality of photodiodes connected in a matrix, and which has improved dynamic range, and light sensitivity and a larger magnitude of signal current.

In accordance with the present invention there is provided a contact type of image sensor device comprising a plurality of photodiodes connected in a matrix for converting a light signal to an electrical signal depending on light intensity, and comprising an equal number of blocking diodes to prevent a cross talk phenomenon, characterized in that a capacity ratio of a photoelectric part constituting said photodiodes to a diode part constituting said blocking diodes is in the range of 2:1 to 30:1.

DESCRIPTION OF THE PREFERRED EMBODIMENTS

Figure 1:
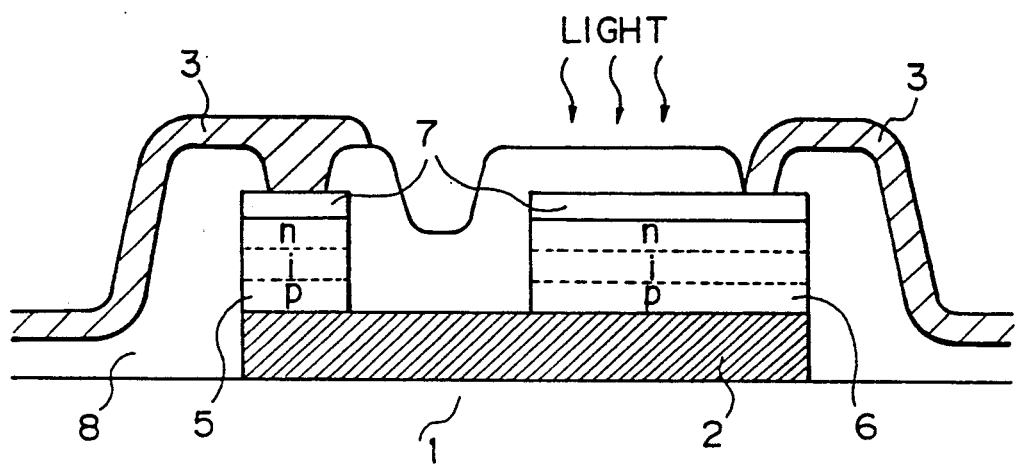
FIG. 1 is a vertical section view of a sensor element of a contact image sensor device which is a first embodiment of the present invention.
Figure 2:
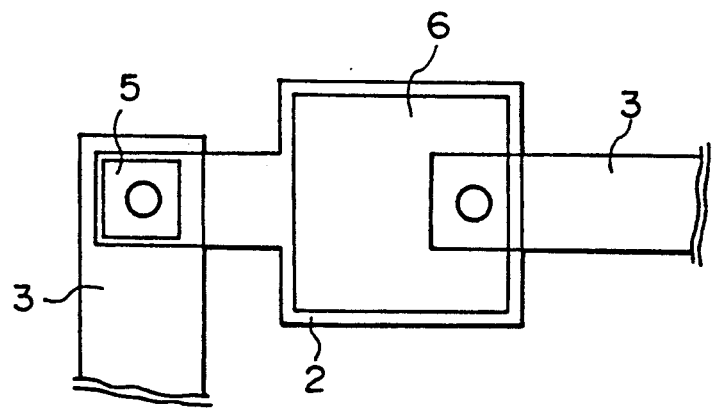
FIG. 2 is a top view of the sensor element.

The first embodiment of the present invention is described referring to FIG. 1 and FIG. 2.

FIG. 1 is a vertical section view of a sensor element of a contact image sensor device which is the first embodiment of the present invention, and FIG. 2 is a top view of the sensor element. In FIGS. 1 and 2, reference numeral 1 designates an insulating material, for example a glass substrate. A lower electrode 2 is arranged on the glass substrate 1. An amorphous silicon photodiode (first diode) 6 having a pin structure is formed on the right end of the lower electrode 2, and an amorphous silicon blocking (second diode) 5 having the same structure is formed on the left end of the lower electrode 2 to derive (output) electrical signals generated by the photodiode in response to light signals impinging on a surface of the photodiode. Upper electrodes 3 are conjugated through a transparent conductive film, such as ITO (Indium Tin Oxide) 7, on the blocking diode 5 and the photodiode 6. Reference numeral 8 designates an insulating layer for insulating between the sensor elements.

Since the blocking diode 5 and the photodiode 6 are formed on a common lower electrode 2, a sensor element having a back-to-back connection is easily fabricated so that the production process is simplified, in the first embodiment. Additionally, since the blocking diode 5 and the photodiode 6 are separately formed, lateral movement of formed carriers does not occur, even if the blocking diode 5 and the photodiode 6 are constructed as pin structure diodes made of an α-Si membrane. Furthermore, incident light from a light source (not shown) arranged on the back side of the sensor element also occurs between the elements, so that fabrication of a complete contact image sensor device is realized.

FIG. 3 to FIG. 8 show the second embodiment of the present invention.

Figure 3:
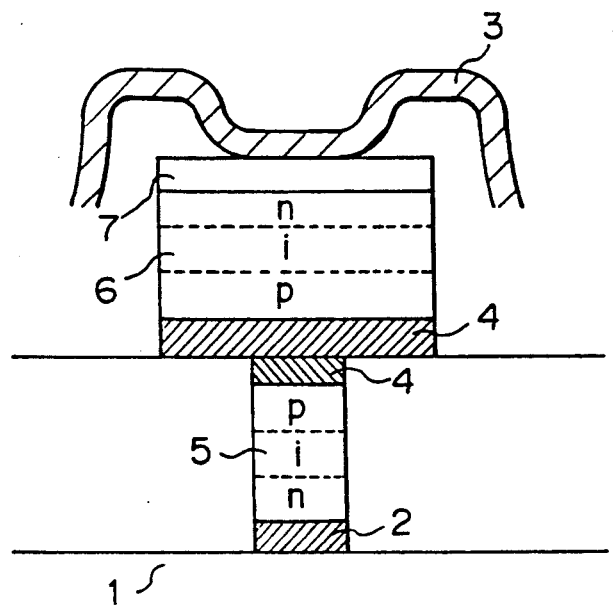
FIG. 3 and FIG. 4 are general cross-sectional views of sensor elements of contact image sensor devices which are the second embodiments of the present invention.
Figure 4:
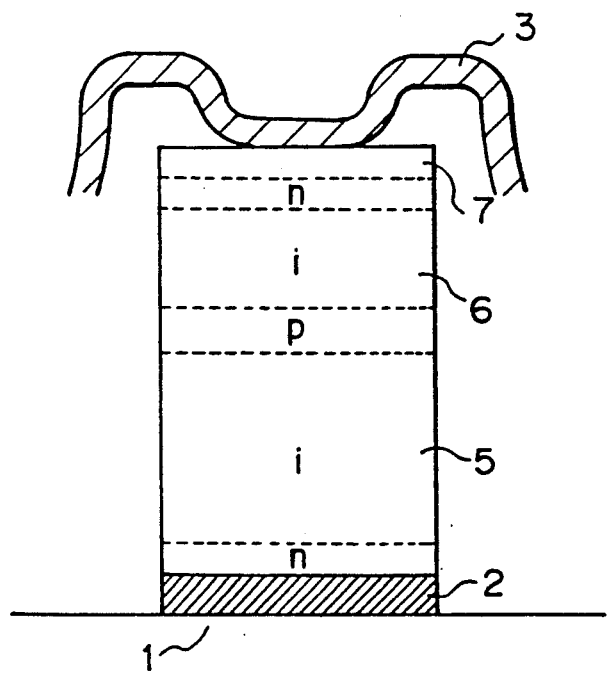

FIG. 3 and FIG. 4 are general cross-sectional views of sensor elements of contact image sensor devices which are the second embodiment of the present invention. In FIG. 3, reference numeral 4 denotes an intermediate electrode. The same reference numerals in the following description as in the first embodiment are used for constituents having similar operation and effect to those in the first embodiment, and thus explanations thereof are left out. The sensor element shown in FIG. 3 has a laminated structure of a blocking diode 5 and a photodiode 6, which is constructed by forming the blocking diode 5 and then forming, through a intermediate electrode 4, the photodiode 6 on the blocking diode 5.

The sensor element shown in FIG. 4 has an integrated structure of a blocking diode 5 and a photodiode 6 on the blocking diode 5, which is constructed by sequentially forming membranes of an n layer, i layer, p layer, i layer, and n layer on a lower electrode 2. In the sensor element having the structure shown in FIG. 3 or FIG. 4, a capacitance ratio of the photodiode to the blocking diode can be altered by altering a ratio of thickness of the i layers of diodes.

As the blocking diode 5 and the photodiode 6 are separately formed on a lower and an upper side, the second embodiment has an operation and effect similar to the first embodiment.

Figure 5:
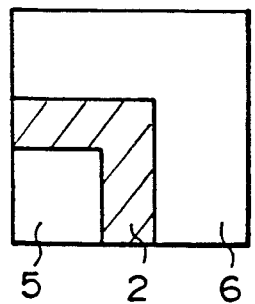
FIG. 5 is a general plan view of a conventional two-dimensional sensor element.
Figure 6:
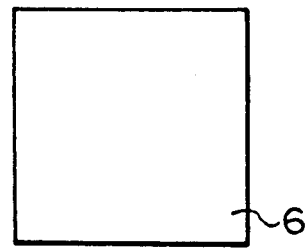
FIG. 6 is a general plan view of the sensor elements of the second embodiment of the present invention.

FIG. 5 is a general plan view of a conventional two-dimensional sensor element, and FIG. 6 is a general plan view of the sensor element of the second embodiment of the present invention. In the conventional sensor element shown in FIG. 5, the blocking diodes 5 occupy a part of the surface of the sensor element. However, only the photodiodes 6 occupy the surface of the sensor element in the second embodiment of the present invention as shown in FIG. 6, so that the ratio of an area occupied by a light receiving part to a unit pixel area, is increased. For example, in the case of a two-dimensional image sensor having sixteen pixels/mm$^2$, when an area for a pixel forming region is 150 μm square, the light accepting area/unit pixel area is 5.8% in a conventional type sensor, and 35% in the present embodiment. The result shows a 40% improvement in sensitivity.

Figure 7:
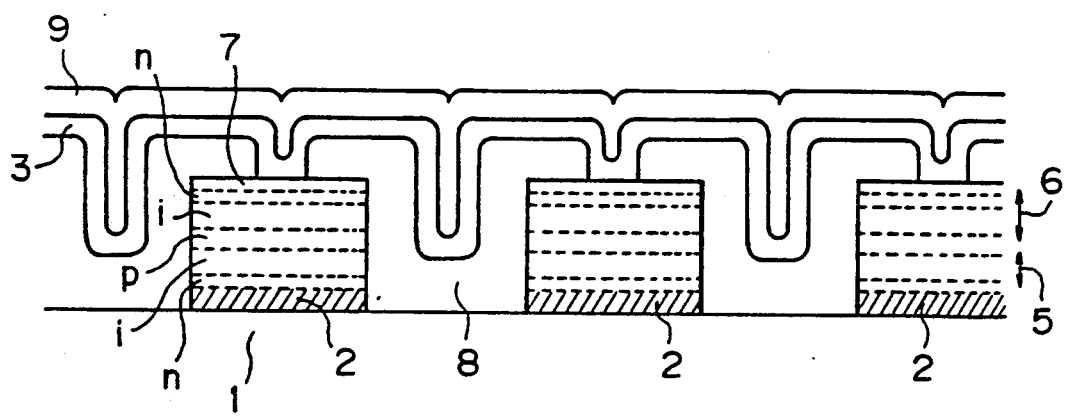
FIG. 7 is a general cross-sectional view of a wiring of the sensor elements in the two-dimensional sensor, according to the present invention.
Figure 8:
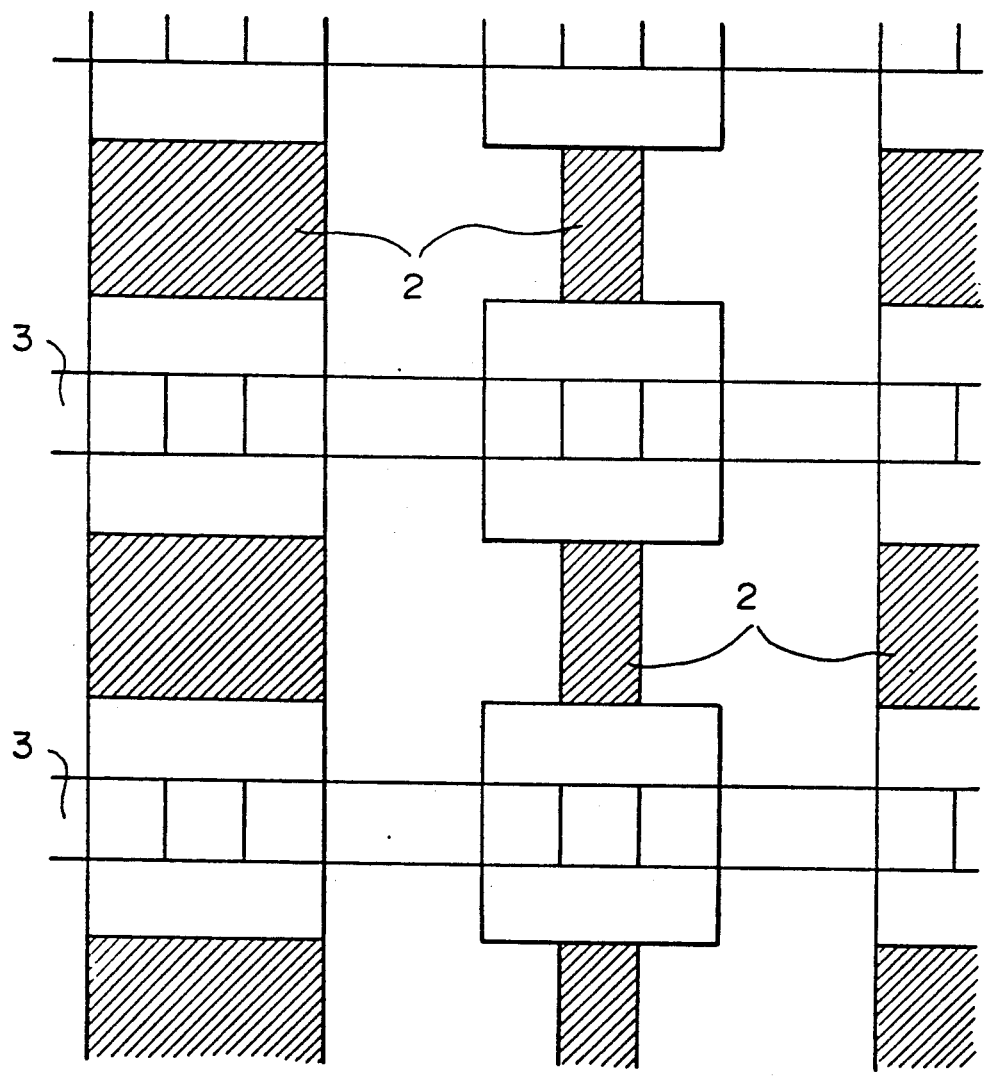
FIG. 8 is a plan view of the wiring.

FIG. 7 and FIG. 8 show a wiring of the sensor elements in the two-dimensional sensor. FIG. 7 is a general cross-sectional view and FIG. 8 is a plan view. In FIG. 7, reference numeral 9 denotes a non-glare membrane provided to improve light absorption. As shown in FIG. 7 and FIG. 8, according to the present invention, a floating capacitance between the wiring for output of a photo signal (upper electrode 3), and the wiring for input of a switch signal (lower electrode 2) is more reduced than in a conventional sensor element, since the two wirings are separately arranged interposing the photoelectric part and diode part.

Additionally, according to the present invention, sensitivity and responsiveness are improved compared with a sensor element which is formed by arranging the photodiodes 6 and the blocking diodes 5 in a plane, since the wiring resistance between the photodiode 6 and the blocking diode 5 is extremely small.

A contact image sensor device of the present invention comprising the aforementioned sensor element is especially suitable for a device including a two-dimensional image sensor or a plurality of line sensors.

Figure 9:
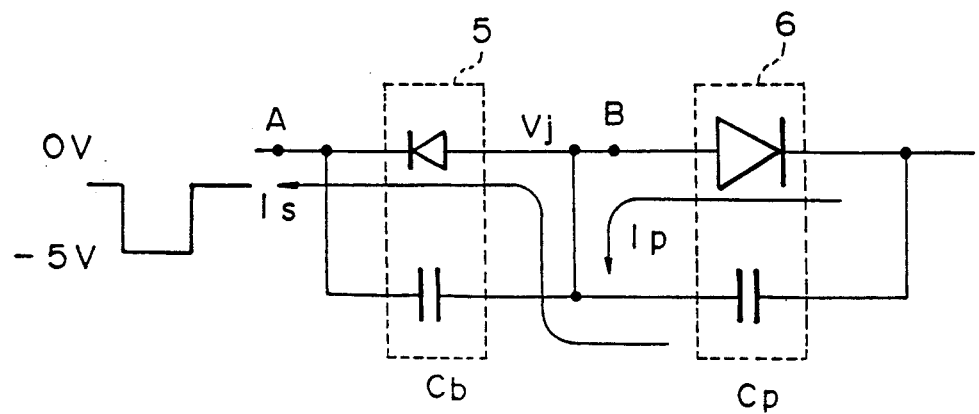
FIG. 9 is a diagram showing an equivalent circuit of the contact image sensor device.

Next, a capacity ratio of the photodiode 6 to the blocking diode 5 in the first and second embodiment of the present invention is described. FIG. 9 shows an equivalent circuit of the contact image sensor device. In FIG. 9, $C_p$ is a junction capacitance of the photodiode 6, and $C_b$ is a junction capacitance of the blocking diode 5. $V_j$ is the potential at B.

Figure 10A:
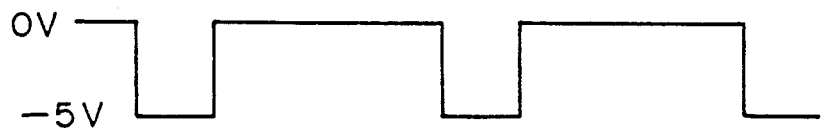
FIGS. 10A, 10B and FIGS. 11A and 11B are timing charts for the equivalent circuit shown in FIG. 9.
Figure 10B:
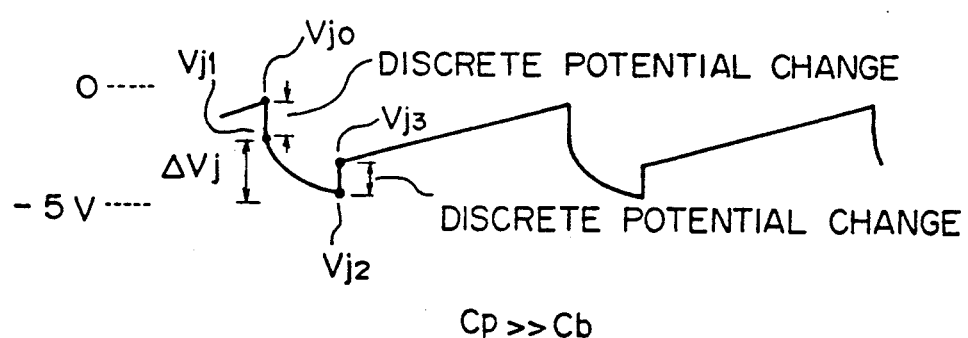
Figure 11A:
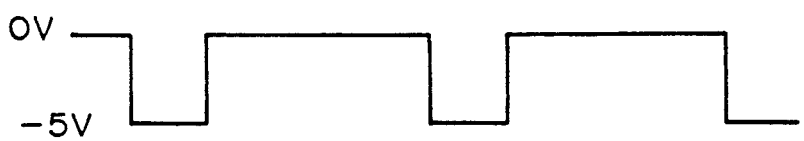
Figure 11B:
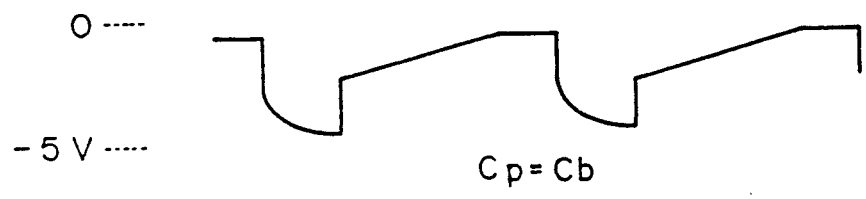

FIGS. 10A, 10B, 11A and 11B are timing charts for the equivalent circuit shown in FIG. 9. FIGS. 10A and 10B provide the timing chart when $C_p >> C_b$, and FIGS. 11A and 11B provide the timing chart when $C_p = C_b$.

When the photodiode 6 receives a light signal, current $I_p$ flows and the junction capacitance $C_p$ is charged. Signal current $I_s$ flows when a negative pulsed signal is applied to point A. The magnitude of the signal current $I_s$ is measured as a time differential of $\Delta V_j (= V_{j1} - V_{j2})$ which is the voltage drop at point B when the negative pulsed signal is applied to the point A. Accordingly, if $\Delta V_j$ is large, the dynamic range of the signal current $I_s$ becomes large and the magnitude of the signal current $I_s$ can be improved.

If the voltage of the pulsed signal applied to the point A is $-5$ V, the potential at the point B just before application of the pulsed signal is $V_{j0}$; the potential at the point B after a discrete potential change caused by a capacitance $C_b$ when the potential at the point A falls in correspondence with a fall in the applied pulsed signal, is $V_{j1}$; the potential at the point B just before a rise of the pulsed signal is $V_{j2}$; and the potential at the point B after a discrete potential change caused by a capacitance $C_b$ in correspondence with a rise in the pulsed signal, is $V_{j3}$; the relationships among $V_{j0}$, $V_{j1}$, $V_{j2}$, and $V_{j3}$ are represented by the following equations.

$$V_{j1} = [-5C_b + (C_p + C_b)V_{j0}]/(C_p + C_b)$$

$$V_{j3} = [5C_b + (C_p + C_b)V_{j2}]/(C_p + C_b)$$

If $C_p >> C_b$ $$V_{j1} = (-5C_b/C_p + V_{j0}) >> (-5/2 + V_{j0})$$

$$V_{j3} = (5C_b/C_p + V_{j2}) << (5/2 + V_{j2})$$

If $C_p = C_b$ $$V_{j1} = (-5/2 + V_{j0})$$

$$V_{j3} = (5/2 + V_{j2})$$

The capacity C of a capacitance is represented by the following equation.

$$C = \epsilon S/d$$

wherein S is a surface area of the capacitance, d is membrane thickness of the capacitance, and $\epsilon$ is a dielectric constant of the capacitance. Accordingly, if a capacity ratio of the photodiode 6 to the blocking diode 5 is large, the dynamic range of the signal current $I_s$ is large and the magnitude of the signal current $I_s$ can be improved because the influence of the aforementioned discrete potential change is small. Namely, as the capacity ratio becomes large, the characteristics of the image sensor is improved.

However, if the area ratio of the photodiode 6 to the blocking diode 5 becomes too large, the area of the blocking diode 5 becomes relatively small, so that the forward current flowing in the blocking diode 5 becomes small. To this end, since the discharge current of the junction capacitance $C_p$ flowing through the blocking diode 5 during application of the pulsed signal becomes small, the drop of $V_{j2}$ becomes insufficient. Therefore, the value of $\Delta V_j$ and the signal current $I_s$ become small and an after image is increased.

The inventors fabricated an image sensor wherein the area of the photodiode 6 is $105 \times 125$ μm² and the area of the blocking diode 5 is $30 \times 30$ μm², namely, capacity ratio is 15:1. As a result of experiment, the signal current was $I_p = 5 \times 10^{-6}$ A when illuminance was 1000 lux. When the capacity ratio was 1:1, signal current was $I_p = 1 \times 10^{-6}$ A (1 msec scan with $-5$ V, 24 μsec pulse). Additionally, as a result of experiments by the inventors, it was discovered that the after image is weak and the light sensitivity is excellent in the image sensor where the capacity ratio of the photodiode 6 to the blocking diode 5 is 2:1 to 30:1, and therefore, the condition is suitable for the contact image sensor device. In the second embodiment, however, in order to realize the capacity ratio of 2:1 to 30:1, altering the membrane thickness ratio of i layers of the photodiode 6 to the blocking diode 5 as shown in FIG. 4 is effective, as is altering the area ratio of the photodiode 6 to the blocking diode 5 as shown in FIG. 3. In the former case, it is possible to keep the area of the blocking diode 5 sufficient, while keeping the capacity ratio 2:1 to 30:1, so that the forward current flowing through the blocking diode 5 can be advantageously kept at a sufficient level.

Next, a membrane thickness of a photoelectric part and a diode part in the first and second embodiments is described.

It has been previously known that if the membrane of the i layer is too thin, the photodiode 6 does not exhibit diode characteristics, and if the membrane of the i layer is too thick, a part of the i layer does not become a depletion layer. For this reason, conventionally, direct current bias voltage has been externally applied to the pin diode in order to cause a sufficient number of light excited carriers to move, especially, in photodiode 6.

The inventors found from experiments that, when the membrane thickness is 3,000 Å to 10,000 Å, the depletion layer extends over the whole i layer and the reverse current does not depend on the applied voltage, so that application of the external direct current bias voltage is not required. As a result, a drive circuit for the image sensor device is simplified. Additionally, when the membrane thickness of the i layer is 3,000 Å to 10,000 Å, the ON voltage of the pin diode in a forward direction is relatively low and switching characteristics of the pin diode are improved in the blocking diode 5. The inventors also found from experiments that, when the membrane thickness of the p layer and the n layer is 100 Å to 500 Å, in the photodiode 6, leakage current in the reverse direction can be suppressed to a sufficiently low level and a ratio of current from bright to dark is increased. The thickness of the p layer and the n layer which are light insensitive layers, is so thin that sensitivity to short wave lengths is not remarkably decreased. Additionally, when the membrane thickness is 100 Å to 500Å, in blocking diode 5, leakage current in the reverse direction is small. As a result, the S/N ratio is improved and a high speed drive of sensor elements is realized.

Accordingly, it is preferable that the i layer of the photoelectric part and diode part be 3,000 Å to 10,000Å, and the p layer and n layer be 100Å to 500Å.

Figure 12:
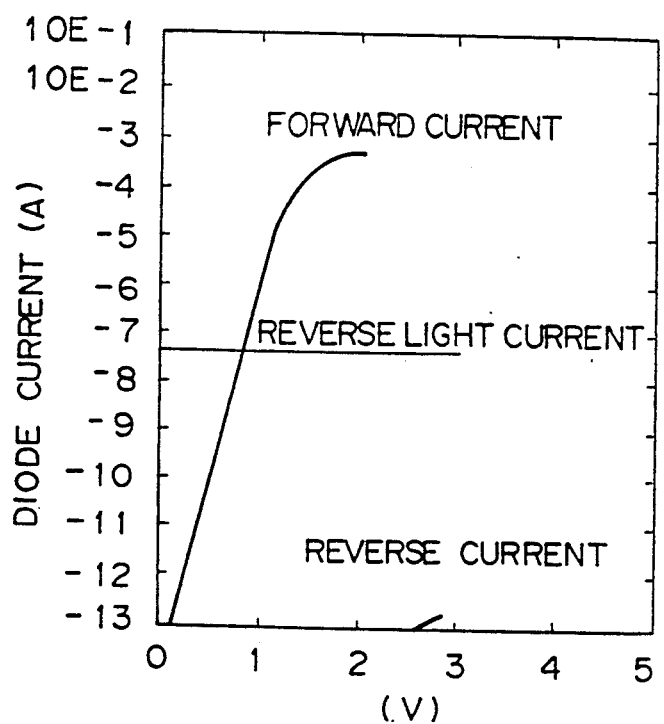
FIG. 12 is a diagram representing diode characteristics of the sensor elements, according to the present invention.

The inventors measured the characteristics of a diode when the membrane thickness of the p layer was 300Å, the membrane thickness of the i layer was 6,000Å, and membrane thickness of the n layer was 300 Å. The result is shown in FIG. 12 (area of the diode = $105 \times 125$ μm²). As shown in FIG. 12, in the aforementioned diode, reverse light current does not depend on bias voltage, and reverse leakage current is less than $10^{-13}$ A. Additionally, the ON voltage in the forward direction is about 1 V. An experiment was performed regarding the contact type image sensor device comprising the photo-diodes 6 and the blocking diodes 5 constructed from the aforementioned diode. As a result, the S/N ratio is estimated to be more than 35 dB.

We claim:

1. An image sensing device, comprising:
   a first diode for converting a light signal impinging on a surface thereof to an electrical signal depending on the intensity of the light signal,
   a second diode electrically coupled to said first diode for deriving the electrical signal from said first diode, wherein said second diode has an area ratio to said first diode in a range of ½ to 1/30; and
   means for blocking incident light from impinging on said second diode.

2. An image sensing device as claimed in claim 1, wherein said first diode includes an amorphous silicon device.

3. An image sensing device as claimed in claim 2, wherein said first diode comprises a p layer having a membrane thickness of 100 Å to 500 Å, an i layer having a membrane thickness of 3,000 Å to 10,000 Å and an n layer having a membrane thickness of 100 Å to 500 Å.

4. An image sensing device as claimed in claim 1, wherein said second diode includes an amorphous silicon device.

5. An image sensing device as claimed in claim 4, wherein said second diode comprises a p layer having a membrane thickness of 100 Å to 500 Å, an i layer having a membrane thickness of 3,000 Å to 10,000 Å, and an n layer having a membrane thickness of 100 Å to 500 Å.

6. An image sensing device as claimed in claim 1, further comprising a common substrate, both said first diode and said second diode being separately formed on a surface of said common substrate.

7. An image sensing device comprising:
   means for converting a light signal impinging on a surface thereof to an electrical signal depending on the intensity of the light signal,
   means for deriving the electrical signal from said converting means wherein said deriving means has an area ratio to said converting means in a range of ½ to 1/30, and
   means for blocking incident light from impinging on said deriving means.

8. An image sensing device as claimed in claim 7, wherein said deriving means has a capacity ratio to said converting means in a range of ½ to 1/30.

9. An image sensing device as claimed in claim 7, wherein said converting means includes an amorphous silicon device.

10. An image sensing device as claimed in claim 9, wherein said converting means comprising a p layer having a membrane thickness of 100 Å to 500 Å, an i layer having a membrane thickness of 3,000 Å to 10,000 Å, and an n layer having a membrane thickness of 100 Å to 500 Å.

11. An image sensing device as claimed in claim 7, wherein said deriving means includes an amorphous silicon device.

12. An image sensing device as claimed in claim 11, wherein said deriving means comprises a p layer having a membrane thickness of 100 Å to 500 Å, an i layer having a membrane thickness of 3,000 Å to 10,000 Å, and a n layer having a membrane thickness of 100 Å to 500 Å.

13. An image sensing device as claimed in claim 7, further comprising a common substrate, both said converting means and said deriving means being separately formed on a surface of said common substrate.

14. An image sensing device as claimed in claim 7, wherein said blocking means is an electrode for the deriving means, said electrode being disposed on said deriving means so as to block the incident light from impinging on said deriving means.

15. An image sensing device according to claim 1, wherein said blocking means is an electrode for said second diode, said electrode being disposed on said second diode so as to block the incident light from impinging on said second diode.

16. An image sensing device, comprising
a first diode for converting a light signal impinging on a surface thereof to an electrical signal depending on the intensity of the light signal; and
a second diode coupled to said first diode for deriving the electrical signal from said first diode, wherein said second diode has an area ratio to said first diode in a range of ½ to 1/30, said first diode overlaying an upper surface of said second diode so as to block any incident light from impinging on said upper surface.

17. An image sensing device, comprising
means for converting a light signal to an electrical signal depending on the light intensity of the light signal; and
means for deriving the electrical signal from said converting means, wherein said deriving means has an area ratio to said converting means in a range of ½ to 1/30 and said converting means is disposed so as to overlay an upper surface of said deriving means thereby to block any incident light from impinging on said upper surface.

* * * * *